United States Patent [19]

Tanabe et al.

[11] Patent Number: 5,776,552

[45] Date of Patent: *Jul. 7, 1998

[54] PROCESS FOR THE VAPOR PHASE SYNTHESIS OF DIAMOND AND HIGHLY CRYSTALLINE DIAMOND

[75] Inventors: Keiichiro Tanabe; Naoji Fujimori, both of Hyogo-ken, Japan

[73] Assignee: Sumitomo Electric Industries, Ltd., Japan

[*] Notice: The term of this patent shall not extend beyond the expiration date of Pat. No. 5,270,028.

[21] Appl. No.: 401,291

[22] Filed: Mar. 9, 1995

Related U.S. Application Data

[63] Continuation of Ser. No. 108,497, Aug. 18, 1993, abandoned, which is a continuation of Ser. No. 899,002, Jun. 15, 1992, abandoned, which is a continuation of Ser. No. 457,170, Dec. 26, 1989, abandoned.

[30] Foreign Application Priority Data

Feb. 26, 1988 [JP] Japan ................................. 63-328349
Dec. 14, 1989 [JP] Japan ................................. 1-322625

[51] Int. Cl.$^6$ ........................................ H05H 1/24
[52] U.S. Cl. ..................... 427/577; 423/446; 117/104
[58] Field of Search .................. 423/446; 427/249, 427/577; 156/DIG. 16, 68; 204/157.47; 117/104

[56] References Cited

U.S. PATENT DOCUMENTS

| | | | |
|---|---|---|---|
| 4,434,188 | 2/1984 | Kamo et al. | 427/122 |
| 4,767,608 | 8/1988 | Matsumoto et al. | 156/DIG. 68 |
| 4,932,331 | 6/1990 | Kuihara et al. | 423/446 |
| 4,938,940 | 7/1990 | Hirose et al. | 423/446 |
| 4,958,590 | 9/1990 | Goforth | 423/446 |
| 4,981,671 | 1/1991 | Miriyoshi et al. | 427/39 |
| 4,989,542 | 2/1991 | Kamo | 423/446 |
| 5,087,434 | 2/1992 | Frenklaub et al. | 423/446 |
| 5,270,028 | 12/1993 | Tanabe et al. | 423/446 |

FOREIGN PATENT DOCUMENTS

158899  7/1986  Japan.

OTHER PUBLICATIONS

Stenman "Width of the 1332-cm$^{-1}$ Raman Line in Diamond" in *Journal of Applied Physics* 40(10) p. 4164 Sep. 1969.

*Primary Examiner*—Michael Lewis
*Assistant Examiner*—Stuart Hendrickson
*Attorney, Agent, or Firm*—Wenderoth, Lind & Ponack

[57] ABSTRACT

High quality diamond excellent in crystalline property as well as transparency, can be synthesized at a high growth speed by a process which comprises using, as a raw material gas, a mixed gas of hydrogen gas A, an inert gas B, a carbon atom-containing gas C and an oxygen atom-containing inorganic gas D in such a proportion as satisfying the following relationship by mole ratio:

$$0.001 \leq B/(A+B+C+D) \leq 0.95$$

$$0.001 \leq C/(A+B+C+D) \leq 0.1$$

$$0.0005 \leq D/C \leq 10$$

except that the carbon atom-containing gas C and the oxygen atom-containing inorganic gas D, cannot simultaneously be the same gas feeding the mixed gas into a reactor in which plasma is then formed by applying a DC or AC electric field at a pressure of 10 to 760 torr and thereby depositing and forming diamond on a substrate arranged in the reactor.

7 Claims, 8 Drawing Sheets

PROCESS FOR THE VAPOR PHASE SYNTHESIS OF DIAMOND AND HIGHLY CRYSTALLINE DIAMOND

This application is a continuation of now abandoned application Ser. No. 08/108,497, filed Aug. 18, 1993; which is a continuation of now abandoned application Ser. No. 07/899,002, filed Jun. 15, 1992; which is a continuation of now abandoned application Ser. No. 07/457,170, filed Dec. 26, 1989.

BACKGROUND OF THE INVENTION

1. Field of the Invention

This invention relates to a vapor phase synthesis method of diamond and diamond obtained by this vapor phase synthesis method and more particularly, it is concerned with a chemical vapor phase synthesis method for producing diamond by using plasma under specified conditions. The resulting diamond can favorably be applied to fields needing higher heat conductivity, smaller dielectric coefficiency, higher transparency, higher specific elasticity, higher strength, higher wear resistance, etc., for example, window materials, oscillation plates, cutting tools, heat sinks, IC bonders, IC substrates, etc.

2. Description of the Prior Art

Up to the present time, diamond has been synthesized in a thermodynamically stable state at a high temperature and high pressure, but of late, it has also been possible to synthesize diamond by a vapor phase synthesis method (CVD method) positively utilizing non-equilibrium state. Actually, a speaker using a dome-shaped oscillation plate of alumina coated with crystalline diamond has been put to practical use.

In this vapor phase synthesis method of diamond, in general, it is proposed to use a hydrocarbon gas diluted with hydrogen in a proportion of 10 times (volume %) as a raw material which is to be excited by a plasma or heat filament. For example, Japanese Patent Laid-Open Publication No. 91100/1983 describes a method comprising previously heating a mixed gas of a hydrocarbon and hydrogen by means of a thermoelectron emission material heated at 1000° C. or higher, feeding the mixed gas over the surface of a substrate and thermally cracking the hydrocarbon to deposit diamond, Japanese Patent Laid-Open Publication No. 110494/1983 describes a method comprising passing hydrogen gas through nonelectrode microwave discharge and then mixing it with a hydrocarbon gas to deposit diamond and Japanese Patent Laid-Open Publication No. 303098/1984 describes a method comprising introducing microwave into a mixed gas of hydrogen gas and inert gas to generate microwave plasma, placing a substrate in the plasma, heating it at 300° to 1300° C. and cracking the hydrocarbon to deposit diamond. The prior art method for the vapor phase synthesis of diamond fundamentally uses, as a raw material, a carbon-containing gas such as hydrocarbon gas and hydrogen gas, as described above, so that the synthesis conditions are limited in such a manner that plasma cannot stably be formed except at a relatively low pressure, for example, up to about 50 torr, and the growth speed is very low.

Furthermore, in Japanese Patent Laid-Open Publication Nos. 158899/1986 and 183198/1986, it is disclosed to add a very small amount of oxygen atom-containing gas to a raw material gas containing carbon and hydrogen so as to improve the crystalline property and growth speed of diamond. However, this method also has disadvantages in that the synthesis conditions, growth speed and synthesis area of diamond are limited because of addition of an inert gas and oxygen atom-containing inorganic gas and deposition of diamond at a low pressure, and accordingly, it is insufficient in applied aspects apart from experimental results.

SUMMARY OF THE INVENTION

It is an object of the present invention to provide a method for the vapor synthesis of diamond using plasma formed by a DC or AC electric field.

It is another object of the present invention to provide a method for the vapor synthesis of diamond, whereby high quality diamond having high transparency, high crystalline property (low defects) and high strength can be obtained at an increased growth speed.

It is a further object of the present invention to provide a method for the gaseous phase synthesis of high quality diamond under synthesis conditions such as pressure which can widely be varied.

These objects can be attained by a process for the vapor phase synthesis of diamond, comprising using, a raw material gas, a mixed gas of hydrogen gas A, an inert gas B, a carbon atom-containing gas C and an oxygen atom-containing inorganic gas D in such a proportion as satisfying the following relationship by mole ratio:

$$0.001 \leq B/(A+B+C+D) \leq 0.95$$

$$0.001 \leq C/(A+B+C+D) \leq 0.1$$

$$0.0005 \leq D/C \leq 10$$

feeding the mixed gas into a reactor in which plasma is then formed by applying a DC or AC electric field at a pressure of 10 to 760 torr and thereby depositing and forming diamond on a substrate placed therein.

BRIEF DESCRIPTION OF THE DRAWINGS

The accompanying drawings are to illustrate in detail the principle and merits of the present invention.

FIG. 16 to FIG. 19 are photographs by a transmission electron microscope, showing the crystalline structure of diamond of Sample No. 29, FIG. 16 and FIG. 17 being those with a magnification of 20,000, FIG. 18 being with a

DETAILED DESCRIPTION OF THE INVENTION

The inventors have made various efforts to find and develop a process for the vapor synthesis of high quality diamond with higher light transmission, crystalline property and strength at an improved growth speed under widely varied synthetic conditions and consequently, have succeeded in attaining this object by feeding to a reactor a mixed raw material gas comprising hydrogen gas A, an inert gas B, a carbon atom-containing gas C and oxygen atom-containing inorganic gas D having the following relationships by mole ratio:

$$0.001 \leq B/(A+B+C+D) \leq 0.95$$

$$0.001 \leq C/(A+B+C+D) \leq 0.1$$

$$0.0005 \leq D/C \leq 10$$

forming plasma therein by applying a DC or AC electric field at a pressure of 10 to 760 torr and depositing diamond on a substrate placed therein.

Based on this finding, the present invention provides a high quality diamond, in which the peak position I ($cm^{-1}$) of diamond by the Raman spectrochemical analysis is shifted toward the lower frequency side to such an extent that the quantity of shift (1332.5−I) satisfies the following relationship, $$0.01 \leq 1332.5-I \leq 1.5$$

preferably $$0.1 \leq 1332.5-I \leq 1.0$$

Furthermore, the present invention provides a high quality diamond having, as a purity index, a peak ratio (H/G) by the Raman spectrochemical analysis of diamond (G) and non-diamond carbon component (H) in the range of at most 0.3, preferably 0.25, a visible ray percent transmission of at least 10% at a wavelength of 600 nm and a resistivity ρ (Ωcm) of $10^9 \leq \rho$.

Specifically, the diamond of the present invention is a vapor phase synthesis diamond film in which the surface diamond film has an average crystal grain diameter (E) and film thickness (F), which satisfy the following relationships:

$$0.3 \leq E/F \leq 8 \text{ and}$$

$$5 \text{ (μm)} \leq F$$

The process for the vapor synthesis of diamond according to the present invention will now be illustrated in detail.

As the inert gas (B), there can be used helium (He), neon (Ne), argon (Ar), krypton (Kr) and xenon (Xe) individually or in combination. Above all, argon is preferable because of being low-priced and available.

As the carbon atom-containing gas (C), there can be used carbon atom-containing compounds which are gaseous under CVD conditions, for example, gaseous aliphatic hydrocarbons such as methane, ethane, propane, ethylene, acetylene and the like; gaseous aromatic hydrocarbons such as benzene; natural gases; gaseous inorganic compounds such as carbon monoxide, carbon dioxide and the like; and gaseous compounds containing small proportions of hetero atoms such as sulfur, oxygen, nitrogen, etc. in the molecules, for example, alcohols such as ethanol, etc., ketones, thiols and the like.

As the oxygen atom-containing inorganic gas (D), there can be used oxygen, steam, air, hydrogen peroxide, carbon monoxide, carbon dioxide, nitrogen oxides such s NO, $NO_2$ and $N_2O$ and sulfur oxides such as $SO_2$ and $SO_3$. In particular, introduction of steam into a reaction tube results in formation of large amounts of H radicals or OH radicals in the zone of the present invention so that the crystalline property and growth speed of diamond be markedly improved.

In the present invention, the raw material gases (A), (B), (C) and (D) are used as essential components, each of which can be used individually or in combination. However, the same gas, e.g. carbon monoxide must not be chosen simultaneously from the raw material gases (C)and (D).

As source of generating plasma, there can be used any of DC and AC electric field. In the latter case, it is preferable to use a high frequency of 1 KHz or higher or microwaves from the standpoint of handling. More preferably, a microwave of at least 500 MHz is used. Furthermore, a magnetic field can be applied with the electric field.

In the present invention, diamond can be synthesized on a larger area without deteriorating the crystalline property at a higher growth speed of diamond, e.g. of several times as higher as in the case of using a hydrocarbon gas and hydrogen gas according to the prior art by using, as a raw material gas, a mixture of hydrogen gas (A), and inert gas (B), a carbon atom-containing gas (C) and an oxygen atom-containing inorganic gas (D) with the specified molar ratio and at the specified pressure.

That is, stable plasma can be formed at a pressure in the range of 10 to 760 torr, preferably 40 to 760 torr, more preferably 60 to 400 torr and a large area can thus be coated with diamond film. Furthermore, a three-dimensional substrate, which is generally hard to be coated with diamond at an appropriate substrate temperature, e.g. 300° to 1200° C. because of excessive concentration of plasma at a high pressure, e.g. several hundreds torr or higher, can readily be coated, and in addition, diamond grains with a grain size of at least several hundreds can be formed at a high speed. This is probably due to that plasma can be formed in stable manner at a higher pressure range than in the prior art, so that the gas temperature in the plasma can be raised to obtain an activated plasma state. In a preferred embodiment of the present invention, there is no substantial pressure difference between the plasma forming zone and the vicinity of a substrate in a reaction tube.

The plasma with high activity can be confirmed by the emission spectroscopy and visual observation thereof. The emission spectroscopy tells that the high activity plasma has features of a relatively weak strength of $H_2$ continuous band and a strong emission strength of hydrogen radical such as H(α) and $C_2$ and CH radicals. The visual observation often tells that the plasma is tinged with a greenish emission of $C_2$ radical (Swann band). Since a carbon atom-containing gas is effectively cracked in the present invention, the plasma is overall observed to be green-whitish.

Thus, the plasma state of the present invention is apparently different from that of the ordinary plasma of, for example, $H_2$—$CH_4$ system free from inert gases, which locks red- or blue violet. Even in the case of an inert gas-introduced plasma, if the pressure is low, for example, 10 torr or less, the emission intensities of H(α), H(β), H(g), $C_2$, CH, etc. are not sufficient and emission of the $H_2$ continuous band is observed. It is confirmed from this phenomenon that cracking of the raw material gas proceeds well in an effective manner under the conditions of the present invention.

The material of the substrate used in the present invention can be the same as that used in the prior art CVD method. Useful examples of the substrate are Si, Mo, W, Ta, Nb, Zr, B, C, Al, SiC, $Si_3N_4$, MoC, $Mo_2C$, WC, $W_2C$, TaC, NbC, BN, $B_4C$, AlN, TiC, TiN, Ti, diamond and the like. The diamond includes natural and/or artificial diamond grains and diamond compacts sintered at high pressures with a binder of Co or Si. Al or Cu can be coated with diamond in such a manner that the substrate temperature does not exceed its melting point.

Figure 1:
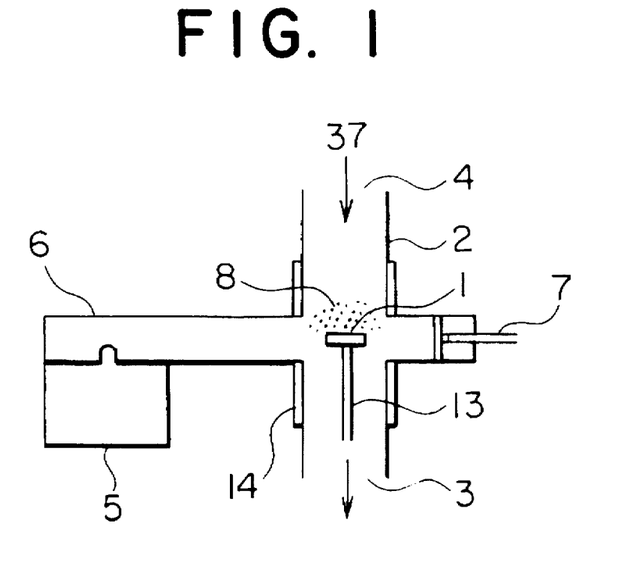
FIG. 1 to FIG. 4 are schematic views of various devices or apparatus for the practice of the process of the present invention, FIG. 1 being a microwave plasma CVD apparatus, FIG. 2 being a DC plasma CVD apparatus, FIG. 3 being a gas supplying system used in the process of the present invention and FIG. 4 being a partially enlarged view of a reaction zone of the microwave plasma CVD apparatus.
Figure 2:
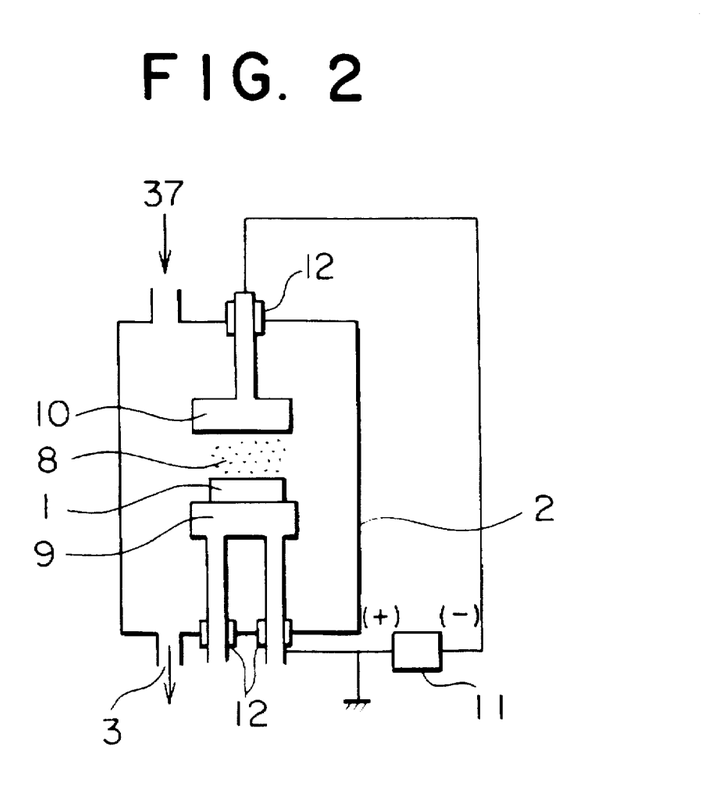
Figure 5:
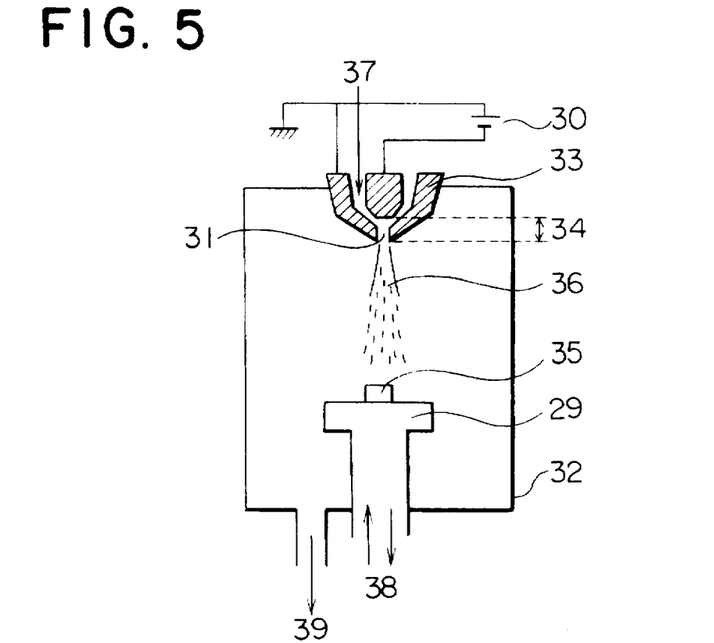
FIG. 5 and FIG. 6 are respectively schematic views of DC and Rf plasma torch apparatus of the prior art, used in Comparative Examples.
Figure 6:
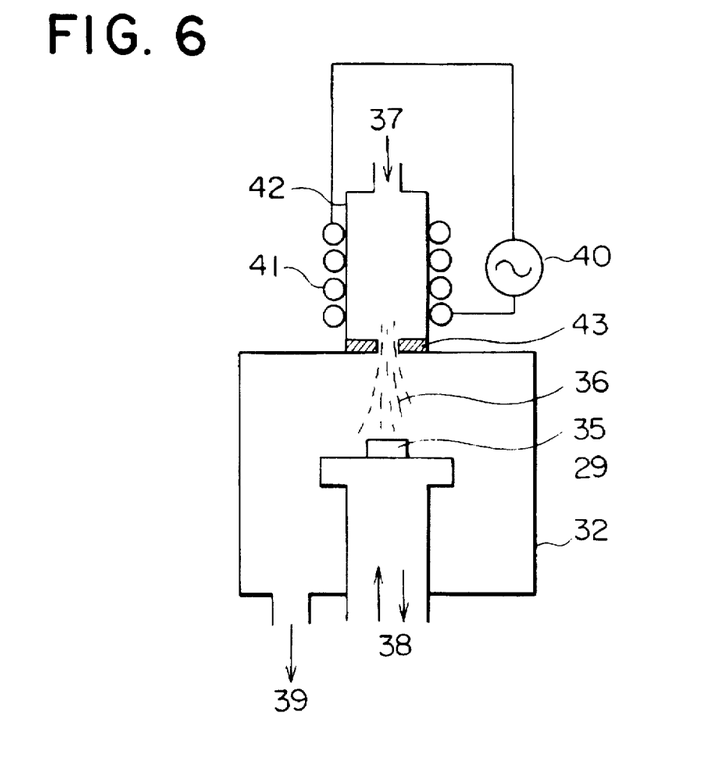

The important feature of the process according to the present invention lies in the fact that the plasma is formed by the ordinary plasma CVD system or natural gas flow, as shown in FIG. 1 and FIG. 2. This is fundamentally different from the high temperature plasma CVD apparatus of the torch type, in which a gas flow is throttled and injected through a nozzle or partition plate, as shown in FIG. 5 and FIG. 6. Since the plasma CVD system used in the present invention is a gas feed system using no injection hole, turbulence of the gas flow and disorder of the plasma temperature and activity are reduced to such an extent that diamond can uniformly be deposited on a substrate, which benefits advantages the yield of diamond from the gas. In addition, the system of the present invention is excellent in control of plasma so that control of the gas composition distribution can correctly be carried out and high quality and highly crystalline diamond can thus be synthesized in stable manner. Therefore, the process of the present invention can be freed from disadvantages, i.e. unstable operation due to deformation of the nozzle and contamination with impurity metals, etc. from the nozzle.

In the process of the present invention, it is preferable to use a quartz reaction tube having a large diameter, for example, having an outer diameter of at least 50 mm.

The stable and uniform deposition of high quality diamond serves to lower the production cost on a commercial scale. When a diamond sheet deposited from gaseous phase is subjected to an etching treatment to remove substrate and used for a heat sink, IC bonder or cutting edge, for example, more time and cost are required in the after-treatment such as a grinding or lapping treatment to improve the flatness or surface roughness of the film in the case of the prior art, while the cost can be reduced in this respect in the case of the present invention.

According to the present invention, it is rendered possible to obtain a homogeneous and high quality diamond thin plate or body with a thickness of at least 100 μm. Since such as thicker product can be brazed with a silver braze to give a sufficient brazing strength, it can be used as a cutting edge of an end mill, etc. and there can be provided a vapor phase growth diamond edge tool with a lower production cost.

In the chemical vapor deposition (CVD) conditions according to the process of the present invention, a mixture raw material gas of hydrogen gas (A), an inert gas (B), a carbon atom-containing gas (C) and an oxygen atom-containing gas satisfies the following relationship by mole.

$$0.001 \leq B/(A+B+C+D) \leq 0.95$$

$$0.001 \leq C/(A+B+C+D) \leq 0.1 \text{ and}$$

$$0.0005 \leq D/C \leq 10$$

and the raw material gas has a pressure of 10 to 760 torr. Preferably, the raw material gas has the following relationship by mole:

$$0.01 \leq B/(A+B+C+D) \leq 0.95$$

$$0.02 \leq C/(A+B+C+D) \leq 0.08 \text{ and}$$

$$0.001 \leq D/C \leq 5$$

and a pressure of 40 to 760 torr. More preferably, the raw material gas has the following relationship by mole.

$$0.04 \leq B/(A+B+C+D) \leq 0.9$$

$$0.005 \leq C/(A+B+C+D) \leq 0.05 \text{ and}$$

$$0.001 \leq D/C \leq 3$$

and a pressure of 60 to 400 torr.

The vapor phase synthesis of diamond using plasma can be carried out by any method to obtain the functions and advantages of the present invention and most preferably, microwaves of 500 MHz or more are used as a source of generating plasma.

The diamond of the present invention will now be illustrated in detail:

When the average crystal grain diameter (E) and grown film thickness (F) of the grown surface of a diamond film obtained by the process of the present invention are observed by means of an optical microscope and scanning electron microscope (SEM), the feature is found that the average crystal grain diameter (E) is relatively larger than the grown film thickness. It is found that the diamond having a relatively large crystal grain diameter is a low defect crystal having less crystal defects such as dislocation and less defect grain boundary by observation using a transmission electron microscope (TEM).

Figure 7:
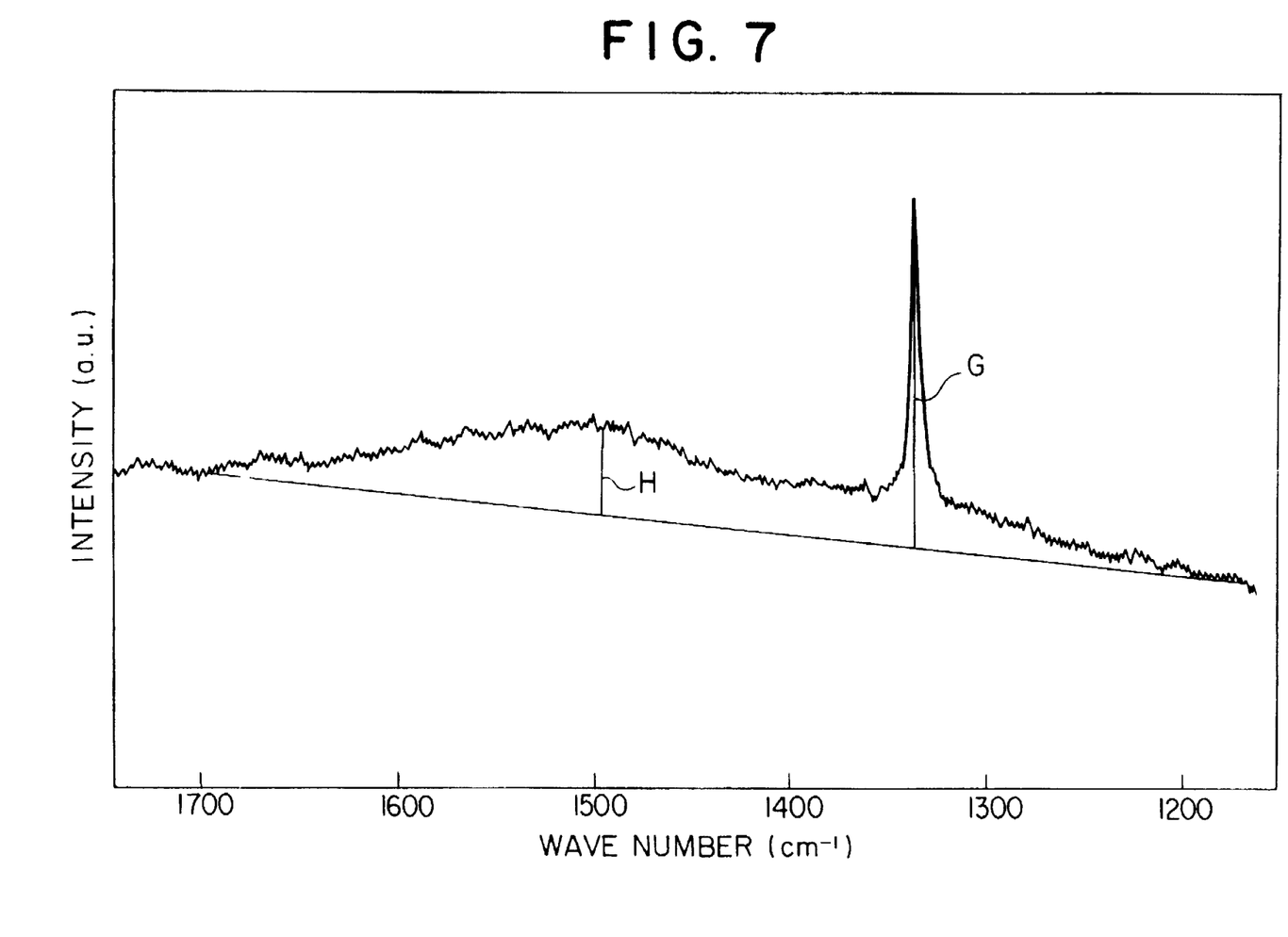
FIG. 7 and FIG. 8 are respectively Raman spectrums of Sample Nos. 29 and 1.
Figure 8:
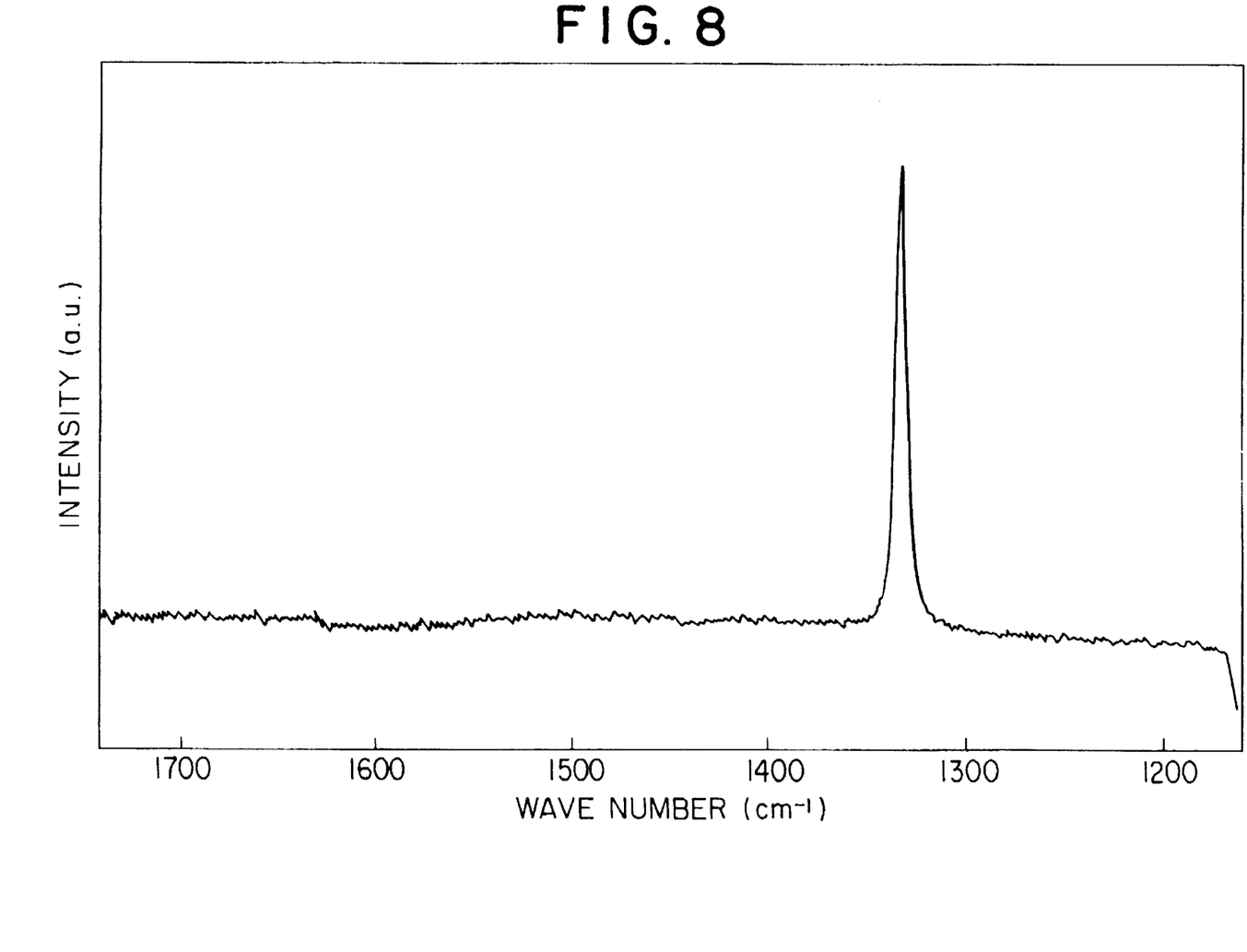

When the Raman shift of the diamond, the Raman shift of the non-diamond carbon and the peak ratio of these shifts are measured by the Raman spectroscopy, the diamond is found to have the feature that it is a diamond with a small quantity of non-diamond constituent as shown in the spectra of FIG. 7 and FIG. 8 and the Raman shift value of the diamond is shifted by several $cm^{-1}$ toward the lower frequency side from that of natural diamond (1332.5 $cm^{-1}$). This phenomenon that the Raman shift value is shifted toward the lower frequency side means that the diamond film has internal intrinsic stress. It is further found that when some internal stress is applied, measurements of the transmission spectra in the ultraviolet, visible and infrared ranges and the thermal conductivity give respectively high values.

For the purpose of rendering effective the crystal grain size, the film thickness (F) should be at least 5 μm and the average crystal grain diameter (E) and film thickness (F) should satisfy the following relationship:

$$0.3 \leq E/F \leq 8$$

If E/F<0.3 or E/√F>8, the above described optical and thermal properties are deteriorated.

If the peak ratio (H/G) of the diamond (G) and non-diamond carbon constituent (H) in the Raman spectrum is in the following range:
ti $H/G \leq 0.3$ the similar effects to described above can be given, while if H/G>0.3, the properties are deteriorated. The preferable range is $H/G \leq 0.25$.

When the peak position I (cm$^{-1}$) of the diamond in the Raman spectrum is shifted toward the lower frequency side to such an extent that the quantity of shift (1332.5−I) is in the following range:

$$0.01 \leq 1332.5 - I \leq 1.5$$

similar effects to those described above can be given, while if 1332.5−I<0.01 or 1332.5−I>1.5, the properties are deteriorated.

The indices of the foregoing properties are a visible ray transmission at a wavelength of 600 nm of at least 10%, a resistivity of at least $10^9$ Ωcm and a thermal conductivity of at least 5 W/cmK.

The following examples are given in order to illustrate the present invention in greater detail without limiting the same.

EXAMPLES

Apparatus for the vapor synthesis of diamond, used in Examples and Comparative Examples, are shown in FIG. 1 to FIG. 6.

FIG. 1 shows a microwave plasma CVD apparatus (μ-PCVD), in which a substrate 1 is supported by a quartz rod 13 and arranged in a quartz tube 2 as a reaction tube, a raw material gas 37 is introduced from an upper gas inlet 4 and discharged from a vacuum exhaust port 3 and microwave is applied from a magnetron 5 through a waveguide 6 to generate plasma 8. 7 designates a plunger and 14 designates a water-cooled jacket.

FIG. 2 shows a DC plasma CVD apparatus (DC-PCVD), in which a plasma 8 is generated by a DC electric field applied to between a support base 9 and cathode 10 using a DC source 11. 1 to 4 and B designate the same parts as in FIG. 1, and 12 is an insulating seal.

Figure 3:
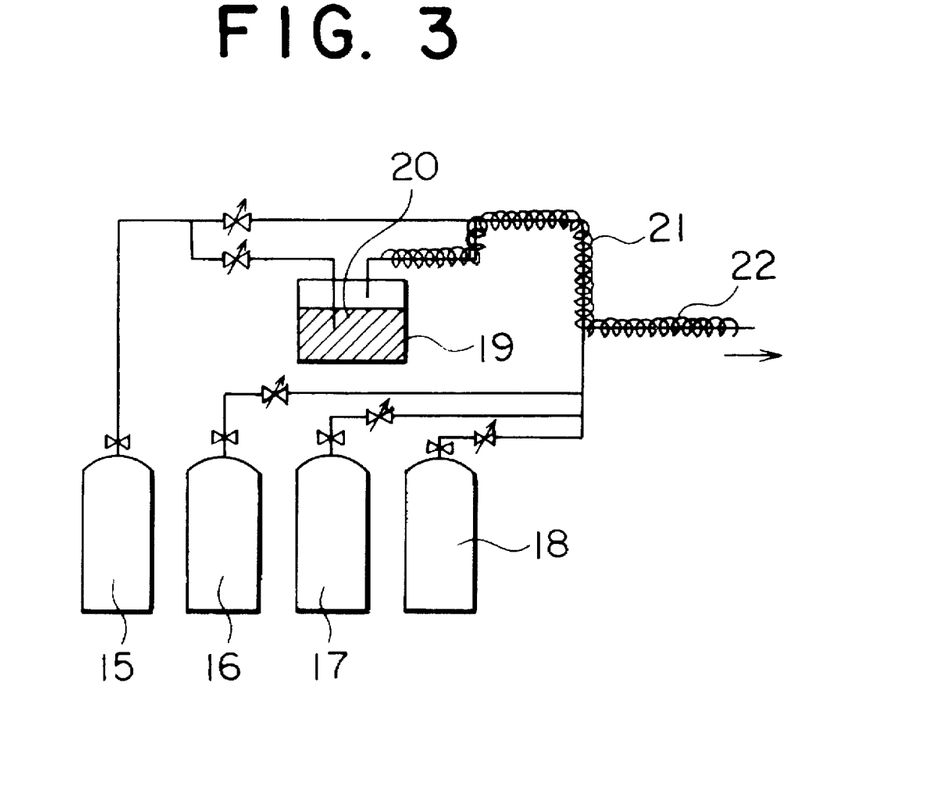

FIG. 3 shows a gas supplying system. When a liquid is fed in the following examples, any of $H_2$ gas 15 and an inert gas 16, as a carrier gas, is bubbled in a bubbling tank 19 carrying a liquid 20 such as $H_2O$ or $C_2H_5OH$ and fed to a reaction tube 23 together with a carbon atom-containing gas 17 and oxygen atom-containing gas 18. The flow rate of the liquid component is calculated in terms of the saturated vapor pressure thereof. When using two or more liquids, bubbling tanks are correspondingly installed and the each liquid is similarly introduced. While the liquid is introduced into the reaction tube 23 from the bubbling tank 19, a gas pipe line 21 is heated at a temperature of higher than that of the bubbling tank 19 by a tape heater 22 so as to prevent the liquid from condensation in the pipe line 21.

Figure 4:
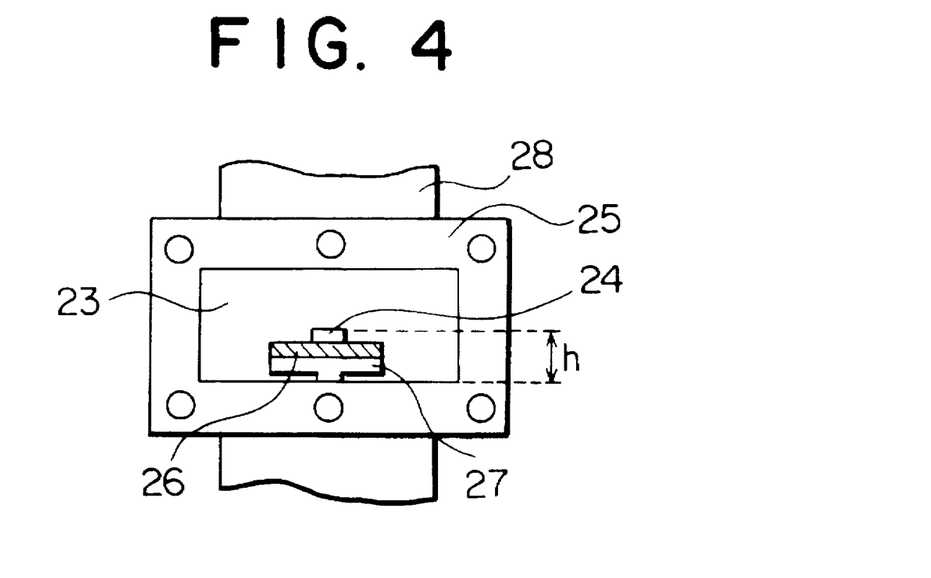

FIG. 4 is a partially enlarged side view of a reaction zone (in the reaction tube 23) of the microwave plasma CVD apparatus, from the opposite direction to the microwave applying side. A substrate 24 is set to give a height h of 10 mm from the lower surface of a waveguide 25 and a Mo plate 26 (40×35×10 mm) is provided under the substrate 24. This Mo plate 26 is subjected to a chamfering treatment of R4 to the corner and edge parts of the upper surface thereof and set in such a manner that the side of 40 mm is perpendicular to the direction of microwave. 27 designates a quartz plate and 28 designates a cavity.

FIG. 5 shows a DC plasma torch apparatus (DC-TORCH) used in Comparative Examples, in which a DC voltage is applied to between electrodes 33 of anode and cathode from a DC source 30, during which a raw material gas 37 is fed between the electrodes 33 and passed through a nozzle 31 to generate a high speed plasma gas flow 36 in a vacuum chamber 32, and this plasma gas flow 36 is blown against a substrate 35 set on a supporting base 29 cooled by cooling water 38 to deposit diamond thereon. 34 designates an electrode gap and 39 designates an evacuation port 39.

FIG. 6 shows a high frequency plasma torch apparatus (RF-TORCH) used in Comparative Examples, in which a raw material gas 37 is fed to a previous vacuum chamber 42 where RF plasma is generated by an RF coil 41, throttled by a partition plate 43 and the resulting plasma gas flow 36 is blown at a high speed against a substrate 35 placed on a supporting base 29 cooled by cooling water 38 in a vacuum chamber 32 in the similar manner to DC-TORCH to deposit diamond thereon. 32 designates a vacuum chamber, 39 designates an exhaust port and 40 designates an RF source.

EXAMPLE 1

Using the μ-PCVD apparatus of FIG. 1, the DC-PCVD apparatus of FIG. 2, the DC torch apparatus of FIG. 3 or the RF-torch apparatus of FIG. 4, diamond was formed on the substrate, which had been subjected to a surface treatment by once lapping the coating surface to adjust the degree of parallel and surface roughness and then roughening by diamond powder of No. 1200 (~20 mm).

A substrate was arranged in a reaction chamber consisting of a quartz tube having an outer diameter of 67 mm and an inner diameter of 64 mm except for Sample Nos. 26, 27 and 28, which was then evacuated through a vacuum exhaust port, an inert gas was introduced thereinto, plasma was generated at a pressure of 1 torr and the substrate was cleaned for 30 seconds by the plasma. For Sample Nos. 26, 27 and 28, quartz tubes of 20 mm, 25 mm and 30 mm in diameter were respectively used. Then, diamond samples were formed under the synthetic conditions shown in Table 1. The vapor deposition time was 10 hours as a standard condition, but for Sample Nos. 29 and 30, it was respectively 24 hours and 130 hours because of the lower vapor deposition speed.

In the case of Sample Nos. 37 to 40, the similar procedure was repeated except using the DC-TORCH apparatus (Sample Nos. 37, 39 and 40) and RF-TORCH apparatus (Sample No. 38) for comparison.

These samples were subjected to surface observation by a scanning electron microscope (SEM), measurement of the thickness and evaluation of the crystalline property by the X-ray diffraction method, Raman spectroscopy and use of a transmission electron microscope (TEM). As to Sample Nos. 1 to 6, 11 to 13, 29, 30, 34 and 37, in Table 2 are shown the ratio (E/F) of the average crystal grain diameter (E) to the film thickness (F) of the diamond film, the percent transmission (%) of a wavelength of 600 nm, the shift quantity (cm$^{-1}$ of from the diamond Raman line 1332.5 (cm$^{-1}$) to the lower wave number side, the peak ratio (H/G) of non-diamond carbon constituent (H) to diamond (G), the resistivity (Ωcm) and thermal conductivity (W/cmK).

The Raman spectroscopic method was carried out by the microscopic Raman spectroscopy with a magnification of 10 times using an argon laser with a wavelength of 514.5 nm at an output of 60 mW, the focus being provided to be just focused on the surface. As one object to be evaluated by the Raman spectroscopy as described above, there was given an index to determine the proportion of non-diamond carbon constituent in the diamond film, i.e. the ratio (H/G) of the highest peak height (H) other non-diamond carbon constituent appearing between 1200 cm$^{-1}$ and 1700 cm$^{-1}$ to the peak height (G) of the diamond appearing at 1332.5±2 cm$^{-1}$. Determination of this height is carried out by measuring the background height taking care of the fluorescence, as shown in FIG. 7. The Raman spectroscopy was generally carried out while taking care of the rising of the sample temperature due to laser by laying an AC thermocouple (alumelchromel) at the side of the sample. In order to improve the resolution of the Raman scattering detection, a high precision double monochromator was used while taking care of the stray light.

Figure 9:
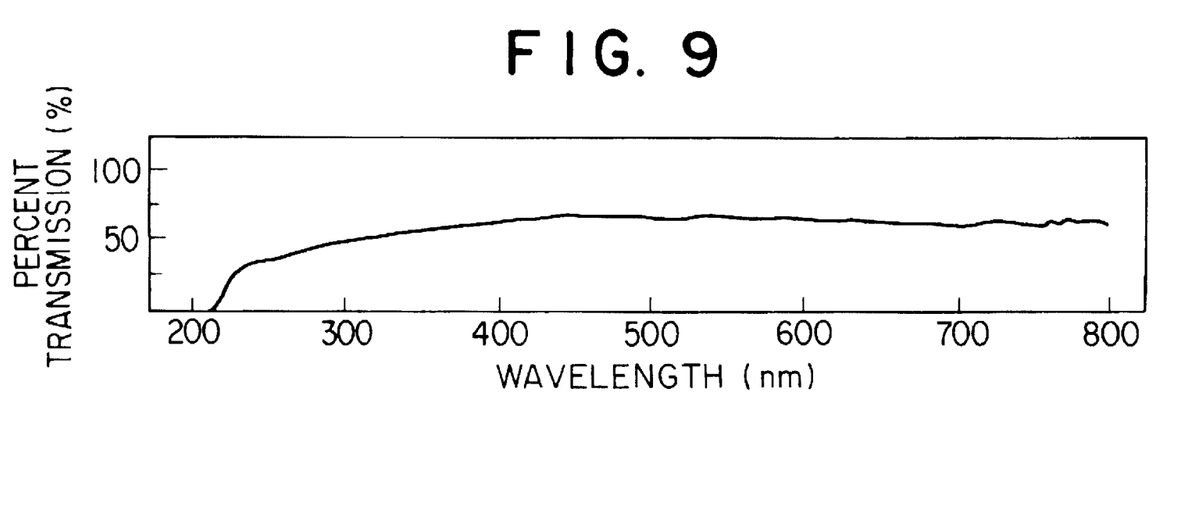
FIG. 9 and FIG. 10 are respectively transmission spectrums of Sample Nos. 1 and 29.
Figure 10:
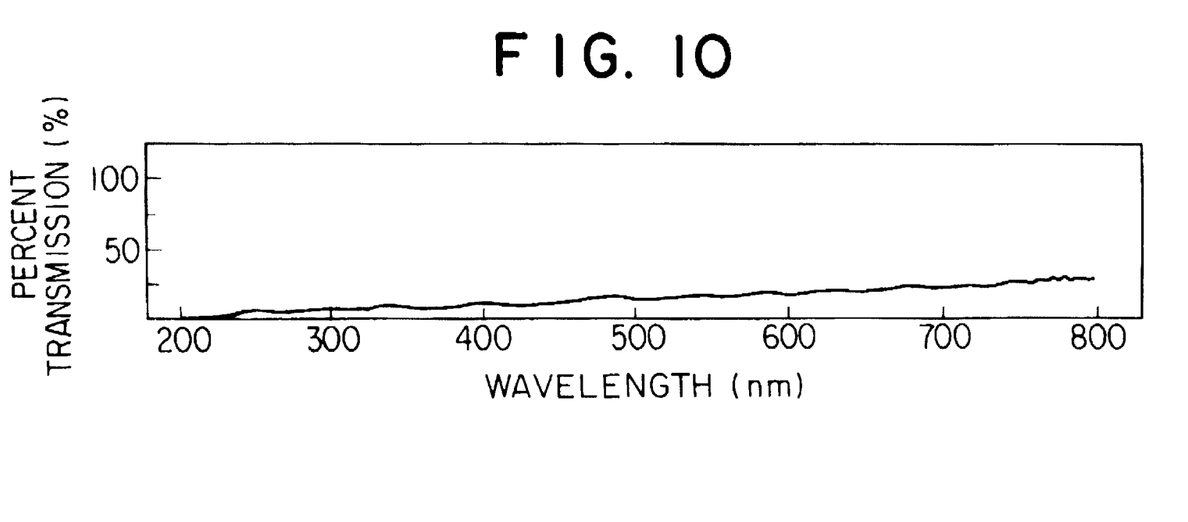

The transmission spectrums of Sample Nos. 1 and 29 from 200 nm to 800 nm are respectively shown in FIG. 9 and FIG. 10, from which it is apparent that the embodiment of the present of the present invention clearly gave a good transmission property and absorption end corresponding to the band gap (5.5 eV) of diamond at 225 nm.

Photographs of the transmission electron microscope (TEM) and transmission electron diffraction (TED) of Sample Nos. 1 and 29 are respectively shown in FIG. 11 to FIG. 19. A specimen for the microscope was prepared by subjecting a diamond film fixed to a sheet mesh to ion etching to a thickness of 0.2 µm under ion etching conditions of an ion incident angle of 30 degrees, ion generating voltage of 5 to 8 KV and ion current of 0.8 mA, until a hole was made in the central part of the specimen, which was then changed, for the purpose of preventing ion damage, into conditions of an ion incident angle of 15 degrees, ion generating voltage of at most 3 KV, ion current of 0.2 mA and period of time of 1.5 hours.

Figure 11:
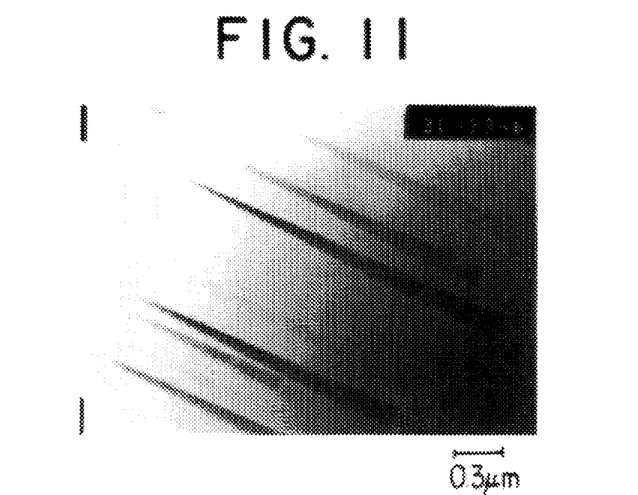
FIG. 11 to FIG. 15 are photographs showing the crystalline structure of diamond of Sample No.1 according to the present invention, FIG. 11 and FIG. 12 being those by a transmission type electron microscope TEM (magnification:×30,000), FIG. 13 being a photograph showing a transmission electron diffraction TED image in the visual field of FIG. 12 and FIG. 14 and FIG. 15 being those with a magnification of 20,000.
Figure 12:
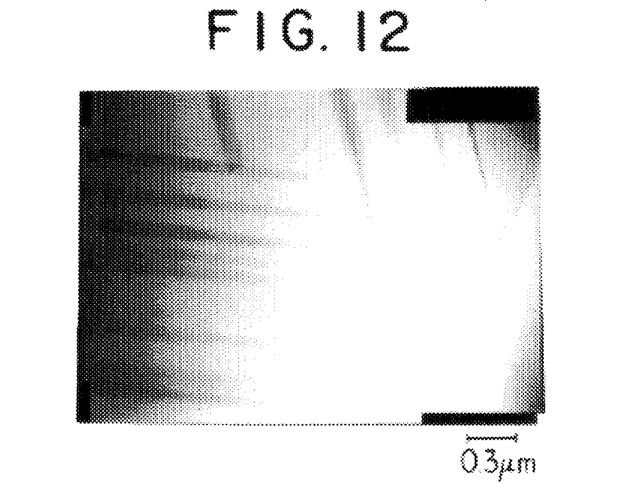

FIG. 11 and FIG. 12 are micrographs of the samples with a magnification of 30,000, in which twins are observed, but no defects such as dislocation are found in this visual field, thus indicating a highly crystalline property.

Figure 13:
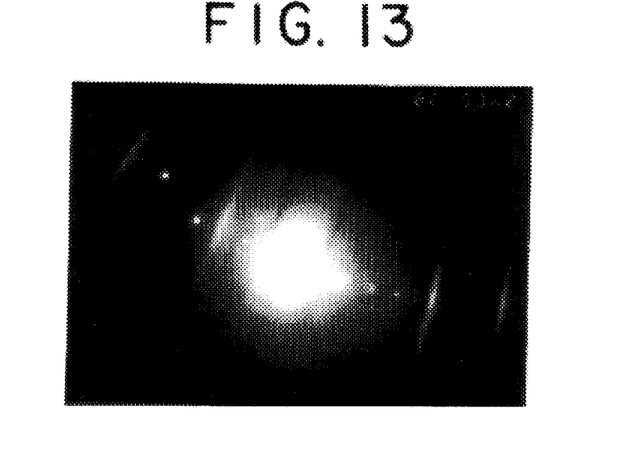

FIG. 13 is a micrograph showing a transmission electron ray diffraction in the visual field of FIG. 12, in which a Kikuchi line is clearly observed, thus indicating a highly crystalline property.

Figure 14:
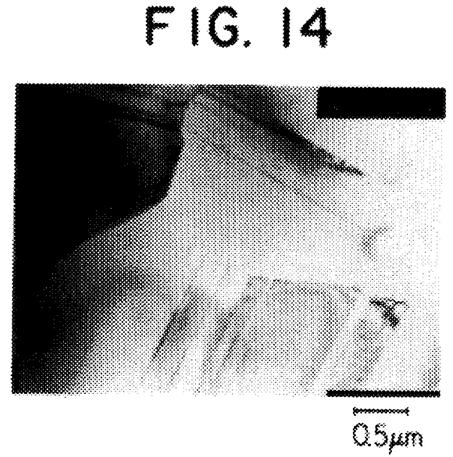
Figure 15:
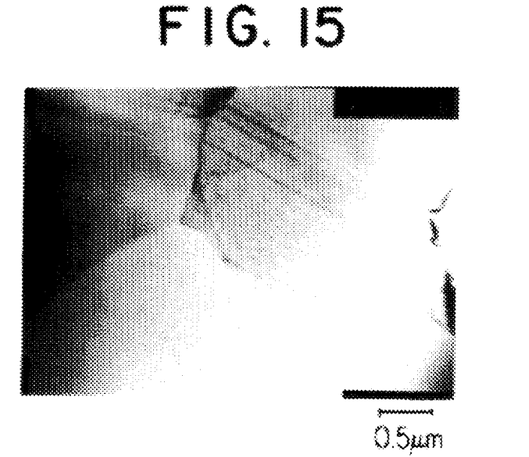

FIG. 14 and FIG. 15 are micrographs of Sample No. 1 with a magnification of 20,000, in which the same area is observed by changing the incident angle of electron rays to determine the grain boundary. It is thus found that there is formed a grain boundary with less concentration of dislocations and less defects.

Figure 16:
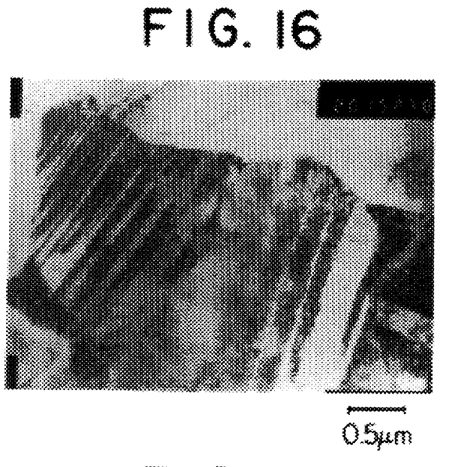
Figure 17:
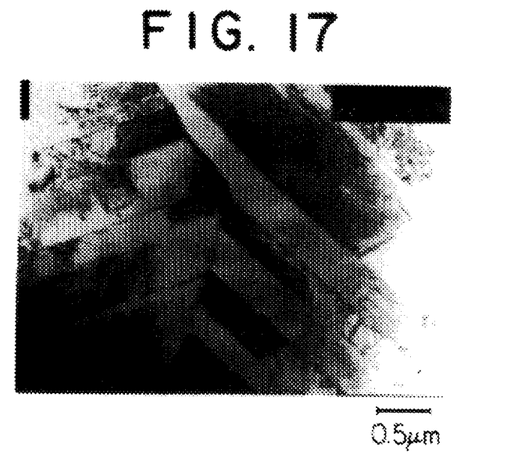

FIG. 16 and FIG. 17 are micrographs of Sample No. 29 with a magnification of 20,000, in which it is observed that there are no dislocations and defects in the grain, being concentrated in the grain boundary, as compared with FIG. 14 and 15 with the same magnification.

Figure 18:
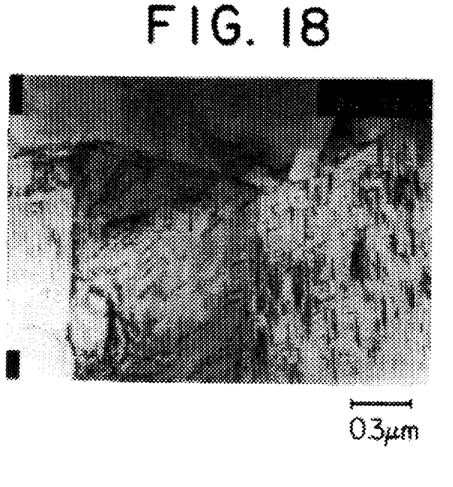
Figure 19:
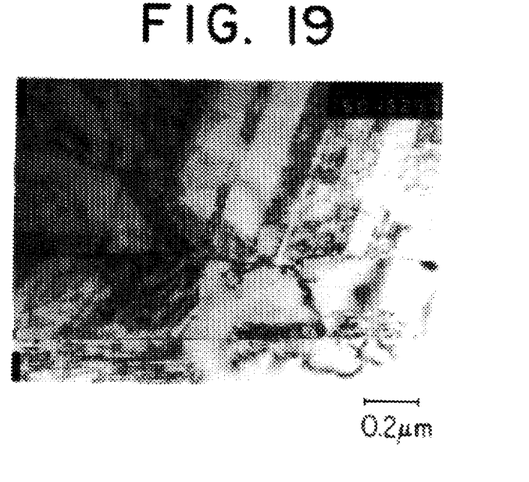

FIG. 18 and FIG. 19 are micrographs of Sample No. 29, respectively with a magnification of 30,000 and 50,000, in which defects and dislocations are clearly observed.

As described above, there is found a clear difference between the Example of the present invention and Comparative Example even by observation of the interior of the grain using a transmission electron microscope and it is considered that the intrinsic properties of diamond, in particular, engineering property, electric property, hardness, thermal conductivity, etc. are largely affected by the number and size of these dislocations and defects.

In Sample Nos. 1 to 28 whose synthetic conditions as to the mole ratios and pressure of the raw material gas are within the scope of the present invention, a high quality diamond film excellent in transparency as well as crystalline property by the Raman spectroscopy, i.e. at most 0.25 can be obtained at a high growth speed, i.e. 8 to 58 µm/hour.

In Sample Nos. 26, 27 and 28 each using a smaller diameter reaction tube, i.e. having an inner diameter of 20, 25 and 30 mm, however, the film quality is somewhat inferior. This experimental result tells that for the purpose of sufficiently obtaining the advantages of the present invention, it is preferable to use a quartz tube having a larger diameter, in particular, an outer diameter of at least 50 mm. This is probably due to that the intensity and density of plasma depends on the diameter of a reaction tube and are readily affected thereby under the conditions of the present invention. Under the conditions of Comparative Examples, on the other hand, the growth speed and film quality of the diamond are not so affected even if the reaction tube has a larger diameter as shown in Sample Nos. 29 to 40. In Sample Nos. 29 to 40 whose synthetic conditions as to the mole ratios and pressure, as described above, are outside the scope of the present invention, the growth speed is much lower, i.e. at most 1 µm/hour, or only coarse diamond film containing amorphous carbon is formed.

Evaluation of the following items (1) to (6) was carried out as to Sample Nos. 1 to 6 and 11 to 13 according to the present invention and Sample Nos.29, 30, 34 and 37 for comparison, thus obtaining results shown in Table 2.

(1) Ratio E/√F of the average crystal grain diameter (E) of the grown surface diamond film to the film thickness (F) thereof, (2) Percent transmission (%) at a wavelength of 600 nm Measurement of the percent transmission was carried out by subjecting a sample under diamond-vapor deposited state on a substrate to dry lapping and then subjecting the substrate to an etching treatment with fluoronitric acid ($HF:HNO_3=1:1$) and laser cutting to prepare a standard sample with a parallel degree of 5×5×0.005 mm and surface roughness of 0.05 µm<Rm for the purpose of putting the above described samples in order.

(3) Shift of the diamond Raman line from 1332.5 $cm^{-1}$ to the lower wave number side by Raman spectroscopy Measurement thereof was carried out while taking care of the resolution and the rising of the sample temperature, as described above.

(4) Ratio (H/G) of the non-diamond carbon constituent peak (H) to the diamond peak (G) by Raman spectroscopy (5) Resistivity ρ (Ωcm)

Measurement thereof was carried out by subjecting an electrode of Ti/Mo/Au to vacuum vapor deposition by an electron gun from a diamond substrate of 2 mm in diameter while taking care of the ohmic property and leakage current.

(6) Thermal conductivity

Measurement thereof was carried out by the use of a simple type thermistor while estimating by relative comparison with the known data for natural diamonds of IIa and Ia.

TABLE 1

| | Sample No. | Synthesis Method | Raw Material Gas and Flow Rate (SCCM) | | | | | Mole Ratio of Raw Material Gas | | | Substrate | | Vapor Deposition | | Note |
|---|---|---|---|---|---|---|---|---|---|---|---|---|---|---|---|
| | | | Hydrogen Gas (A) | Inert Gas (B) | Carbon Atom Containing Gas (C) | | Oxygen Atom Containing Gas (D) | | B/(A+B+C+D) | C/(A+B+C+D) | D/C | Material | size (mm) | Pressure torr | Speed (μm/h) | H/G |
| Present Invention (Example) | 1 | μ-PCVD | 200 | Ar 80 | CH₄ | 4.28 | H₂O | 1.29 | 0.280 | 0.0150 | 0.3000 | Si | 20 × 20 × 2.5 | 120 | 12.0 | 0.05 | *1 |
| | 2 | " | 200 | Ar 100 | CH₄ | 5.21 | H₂O | 1.04 | 0.327 | 0.0170 | 0.2000 | Si | 20 × 20 × 2.5 | 150 | 16.0 | 0.05 | |
| | 3 | " | 200 | Ar 120 | CH₄ | 4.25 | H₂O | 2.76 | 0.367 | 0.0130 | 0.6500 | Si | 20 × 20 × 2.5 | 200 | 15.0 | 0.04 | |
| | 4 | " | 400 | He 80 | CH₄ | 9.91 | H₂O | 5.45 | 0.162 | 0.0200 | 0.5500 | Mo | 20 × 20 × 2.5 | 180 | 20.0 | 0.08 | |
| | 5 | " | 200 | Ar 100 | C₂H₅OH | 3.34 | H₂O | 0.33 | 0.329 | 0.0110 | 0.1000 | Mo | 25 × 25 × 2.5 | 280 | 45.0 | 0.04 | |
| | 6 | " | 500 | Ne 100 | H₂H₅OH | 28.38 | O₂ | 2.27 | 0.159 | 0.0450 | 0.0800 | Si | 10 × 10 × 2.5 | 82 | 22.0 | 0.09 | |
| | 7 | " | 200 | Ar 400 | C₂H₅OH | 4.23 | H₂O | 0.17 | 0.662 | 0.0070 | 0.0400 | Mo | 40 × 35 × 5 | 75 | 18.0 | 0.10 | |
| | 8 | " | 150 | Kr 50 | C₂H₅OH | 1.61 | H₂O₂ | 0.03 | 0.248 | 0.0080 | 0.0200 | Si | 20 × 20 × 2.5 | 200 | 11.0 | 0.09 | |
| | 9 | " | 200 | Ar 100 | CH₄ | 9.73 | CO | 14.59 | 0.308 | 0.0300 | 1.5000 | Si | 15 × 15 × 2.5 | 120 | 25.0 | 0.11 | |
| | 10 | DC-PCVD | 200 | Ar 100 | C₂H₅OH | 14.49 | H₂O | 30.42 | 0.290 | 0.0420 | 2.1000 | Si | 25 × 25 × 2.5 | 340 | 22.0 | 0.12 | |
| | 11 | DC-PCVD | 200 | Ar 50 | CH₄ | 10.43 | O₂ | 0.31 | 0.192 | 0.0400 | 0.0300 | Si | 25 × 25 × 2.5 | 150 | 28.0 | 0.13 | |
| | 12 | μ-PCVD | 200 | Ar 100 | CH₄ | 15.86 | O₂ | 1.27 | 0.315 | 0.0500 | 0.0800 | Mo | 10 × 10 × 2.5 | 380 | 52.0 | 0.13 | |
| | 13 | " | 350 | Ar 120 | C₂H₂ | 42.22 | H₂O | 50.66 | 0.213 | 0.0750 | 1.2000 | Si | 20 × 20 × 2.5 | 120 | 43.0 | 0.15 | |
| | 14 | " | 200 | Ar 300 | C₃H₈ | 1.51 | H₂O | 3.33 | 0.594 | 0.0030 | 2.2000 | Mo | 40 × 35 × 5 | 200 | 14.0 | 0.12 | |
| | 15 | " | 200 | Ar 100 | CH₄ | 29.73 | O₂ | 0.59 | 0.303 | 0.0900 | 0.0200 | Si | 10 × 10 × 2.5 | 180 | 25.0 | 0.16 | |
| | 16 | " | 2000 | Ar 500 | CH₄ | 7.52 | CO₂ | 0.23 | 0.199 | 0.0030 | 0.0300 | Mo | 40 × 35 × 5 | 220 | 8.0 | 0.14 | |
| | 17 | " | 100 | Ne 30 | CH₄ | 2.46 | CO | 4.31 | 0.219 | 0.0180 | 1.7500 | Mo | 40 × 35 × 5 | 180 | 7.0 | 0.15 | |
| | 18 | " | 800 | Ar + He 1200 | C₂H₂ | 105.31 | H₂O | 0.95 | 0.570 | 0.0500 | 0.0090 | Mo | 20 × 20 × 2.5 | 300 | 58.0 | 0.20 | |
| | 19 | DC-PCVD | 200 | Ar 1000 | C₂H₅OH | 2.42 | CO | 7.01 | 0.827 | 0.0020 | 2.9000 | Si | 40 × 35 × 5 | 420 | 8.0 | 0.19 | |
| | 20 | μ-PCVD | 1500 | Ar + Kr 100 | C₂H₂ | 8.16 | CO | 24.49 | 0.061 | 0.0050 | 3.0000 | Si | 20 × 20 × 2.5 | 320 | 9.8 | 0.18 | |
| | 21 | μ-PCVD | 200 | Ar 80 | C₂H₅OH | 14.74 | O₂ | 0.13 | 0.271 | 0.0500 | 0.0090 | Mo | 25 × 25 × 2.5 | 120 | 33.0 | 0.20 | |
| | 22 | " | 400 | Ar 50 | CH₄ | 4.09 | O₂ | 0.00 | 0.110 | 0.0090 | 0.0008 | Mo | 10 × 10 × 2.5 | 85 | 16.0 | 0.18 | |

TABLE 1-continued

| | Sample No. | Synthesis Method | Raw Material Gas and Flow Rate (SCCM) | | | | | Mole Ratio of Raw Material Gas | | | Substrate | | Vapor Deposition | | Note |
|---|---|---|---|---|---|---|---|---|---|---|---|---|---|---|---|
| | | | Hydrogen Gas (A) | Inert Gas (B) | Carbon Atom Containing Gas (C) | | Oxygen Atom Containing Gas (D) | | B/(A+B+C+D) | C/(A+B+C+D) | D/C | Material | size (mm) | Pressure torr | Speed (μm/h) | H/G |
| Example | 23 | " | 250 | Ar 500 | CH$_3$OH | 141.21 | CO | 677.82 | 0.319 | 0.0900 | 4.8000 | Mo | 40 × 35 × 5 | 300 | 40.0 | 0.24 |
| | 24 | " | 500 | Ar 500 | C$_2$H$_5$OH | 159.09 | CO$_2$ | 1113.64 | 0.220 | 0.0700 | 7.0000 | Si | 5 × 5 × 2.5 | 420 | 25.0 | 0.25 |
| | 25 | " | 100 | He 10 | CH$_3$COCH$_3$ | 0.17 | CO | 0.41 | 0.090 | 0.0015 | 2.5000 | Si | 5 × 5 × 2.5 | 250 | 12.0 | 0.19 |
| | 26 | " | 200 | Ar 50 | CH$_4$ | 20.18 | O$_2$ | 18.17 | 0.173 | 0.0700 | 0.9000 | Mo | 10 × 10 × 2.5 | 120 | 9.0 | 0.24 | *2 |
| | 27 | " | 1000 | He 30 | C$_2$H$_5$OH | 57.87 | N$_2$O | 69.44 | 0.026 | 0.0500 | 1.2000 | Mo | 20 × 20 × 2.5 | 200 | 12.0 | 0.22 | *3 |
| | 28 | " | 100 | Ar 150 | CH$_4$ | 8.24 | NO | 16.48 | 0.546 | 0.0300 | 2.0000 | Si | 10 × 10 × 2.5 | 400 | 10.0 | 0.25 | *4 |
| Comparison | 29 | " | 200 | 0 | CH$_4$ | 1.80 | | 0.00 | 0.000 | 0.0089 | 0.0000 | Si | 10 × 10 × 2.5 | 30 | 0.5 | 0.26 | *5 |
| | 30 | μ-PCVD | 1000 | 0 | CH$_4$ | 1.00 | | 0.00 | 0.000 | 0.0010 | 0.0000 | Si | 10 × 10 × 2.5 | 40 | 0.1 | 0.26 |
| | 31 | " | 100 | 0 | C$_3$H$_8$ | 2.00 | | 0.00 | 0.000 | 0.0196 | 0.0000 | Mo | 20 × 20 × 2.5 | 50 | 0.6 | 0.28 |
| | 32 | " | 200 | 0 | C$_2$H$_2$ | 2.02 | O$_2$ | 0.12 | 0.000 | 0.0100 | 0.0600 | Si | 10 × 10 × 2.5 | 35 | 0.1 | 0.30 |
| | 33 | " | 200 | 0 | C$_2$H$_5$OH | 1.01 | | 0.00 | 0.000 | 0.0050 | 0.0000 | Mo | 20 × 20 × 2.5 | 200 | 0.0 | — | *6 |
| | 34 | DC-PCVD | 200 | 0 | CH$_4$ | 2.00 | | 0.00 | 0.000 | 0.0099 | 0.0000 | Mo | 20 × 20 × 2.5 | 200 | 15.0 | 0.40 |
| | 35 | " | 200 | 0 | C$_2$H$_5$OH | 2.43 | | 0.00 | 0.000 | 0.0120 | 0.0000 | Si | 3 × 3 × 2.5 | 150 | 12.0 | 0.50 |
| | 36 | " | 200 | 0 | CH$_4$ | 6.19 | | 0.00 | 0.000 | 0.0300 | 0.0000 | Si | 3 × 3 × 2.5 | 120 | 20.0 | 0.45 |
| | 37 | DC-TORCH | 1000 | Ar 5000 | CH$_4$ | 24.10 | | 0.00 | 0.830 | 0.0040 | 0.0000 | Mo | 3 × 3 × 2.5 | 150 | 18.0 | 0.40 |
| | 38 | RF-TORCH | 1500 | Ar 10000 | CH$_4$ | 34.60 | | 0.00 | 0.867 | 0.0030 | 0.0000 | Si | 5 × 5 × 2.5 | 150 | 22.0 | 0.50 |
| | 39 | DC-TORCH | 3000 | Ar 15000 | C$_2$H$_5$OH | 90.45 | | 0.00 | 0.829 | 0.0050 | 0.0000 | Si | 5 × 5 × 2.5 | 200 | 15.0 | 0.80 |
| | 40 | " | 10000 | Ar 20000 | CH$_4$ | 241.94 | | 0.00 | 0.661 | 0.0080 | 0.0000 | Mo | 10 × 10 × 2.5 | 250 | 40.0 | 0.60 |
| | | | | | | | | | | | | Mo | 10 × 10 × 2.5 | 230 | | | |

*1 Raman spectrum: FIG. 8, Transmission spectrum: FIG. 9, TEM image: FIG. 12, 14, 15, TED image: FIG. 13
*2 Quartz reaction tube of 20 mm in diameter
*3 Quartz reaction tube of 25 mm in diameter
*4 Quartz reaction tube of 30 mm in diameter
*5 Raman spectrum: FIG. 7, Transmission spectrum: FIG. 10, TEM image: FIG. 16 to FIG. 19
*6 —

TABLE 2

Experimental Results

| Example | Sample No. | Vapor Deposition Time (h) | Film Thickness (μm) | Average Crystal Grain Diameter (E) to Film Thickness (F) Ratio E/F | Percent Transmission at 600 nm (%) | Shift from Diamond Raman Line 1332.5 cm$^{-1}$ (cm$^{-1}$) | Non-Diamond to Diamond Peak Ratio H/G | Resistivity ρ (Ω · cm) | Thermal Conductivity (W/cm · K) | Note |
|---|---|---|---|---|---|---|---|---|---|---|
| Present Invention | 1 | 1 | 12 | 0.9 | 65 | 0.8 | 0.05 | ≥10$^{12}$ | 14.0 | TEM TED |
| | 2 | 1 | 16 | 1.2 | 63 | 0.9 | 0.05 | ≥10$^{12}$ | 12.8 | |
| | 3 | 1 | 15 | 2.4 | 62 | 1.0 | 0.04 | ≥10$^{12}$ | 14.5 | |
| | 4 | 1 | 20 | 1.5 | 58 | 0.7 | 0.08 | ≥10$^{12}$ | 10.5 | |
| | 5 | 1 | 45 | 3.2 | 55 | 0.3 | 0.04 | ≥10$^{12}$ | 9.8 | |
| | 6 | 1 | 22 | 0.8 | 51 | 0.2 | 0.09 | ≥10$^{12}$ | 12.5 | |
| | 11 | 1 | 28 | 0.7 | 45 | 0.15 | 0.13 | ≥10$^{12}$ | 11.2 | |
| | 12 | 1 | 52 | 3.5 | 50 | 0.18 | 0.13 | ≥10$^{12}$ | 9.5 | |
| | 13 | 1 | 43 | 0.6 | 47 | 0.2 | 0.15 | ≥10$^{12}$ | 8.5 | |
| Comparison | 29 | 24 | 12 | 0.2 | 9 | 0.0 | 0.26 | 3 × 10$^{7}$ | 4.2 | TEM TED |
| | 30 | 130 | 13 | 0.1 | 7 | 0.0 | 0.26 | 5 × 10$^{6}$ | 3.8 | |
| | 34 | 1 | 15 | 0.3 | 5 | 0.0 | 0.40 | 1.2 × 10$^{5}$ | 2.0 | |
| | 37 | 1 | 18 | 0.4 | 3 | 0.0 | 0.40 | 1.0 × 10$^{5}$ | 1.7 | |

EXAMPLE 2

A diamond film was prepared by the conditions corresponding to Sample No. 1 shown in Table 1, subjected to etching with fluoronitric acid (HF:HNO$_3$=1:1) to remove the substrate and then subjected to laser processing to obtain a diamond plate substrate of 10 mm×10 mm×0.2 mm (thickness). The resulting substrate was placed on a Mo plate in the apparatus of FIG. 1 and diamond was deposited and grown by the μ-PVCD method for 2 hours using a microwave output of 800 W, a pressure of 300 torr and other synthetic conditions corresponding to Sample No. 1, thus obtaining a diamond plate grown to a thickness of 0.8 mm.

Evaluation of the thus obtained diamond plate in an analogous manner to Example 1 showed a good crystalline diamond.

EXAMPLE 3

A diamond single crystal grain of 250 μm in a diameter was prepared by the ultra-high pressure method, placed on a Mo plate of 40 mm (diameter)×0.2 mm (thickness) in the apparatus of FIG. 1, into which a mixture of 200 SCCM of hydrogen gas (A), 100 SCCM of Ar gas (B), 2 SCCM of acetylene gas (C) and 1 SCCM of steam(D) (mole ratios: B/(A+B+C+D)=0.33, C/(A+B+C+D)=0.0066 and D/C=0.5) was introduced, and diamond was deposited and grown for 5 hours by the μ-PVCD method using a microwave output of 800 W and a pressure of 500 torr, thus obtaining a diamond grain grown to a diameter of 0.8 mm.

Evaluation of the thus obtained diamond grain in an analogous manner to Example 1 showed a good crystalline diamond.

EXAMPLE 4

A diamond single crystal grain of 3 mm in diameter was prepared by the ultra-high pressure method, placed on the center of a Mo plate of 40 mm×35 mm×10 mm (thickness) in the apparatus of FIG. 1, into which a mixture of 200 SCCM of hydrogen gas (A), 50 SCCM of He gas (B), 2 SCCM of propane gas (C) and 0.5 SCCM of steam (D) (mole ratios: B/(A+B+C+D)=0.198, C/(A+B+C+D)=0.0079 and D/C=0.25) was introduced, and diamond was deposited and grown for 5 hours by the μ-PVCD method using a microwave output of 200 W and a pressure of 600 torr, thus obtaining a diamond grain grown to a diameter of 0.6 mm.

This diamond grain had a somewhat graphitized surface, but gave a real diamond form by a bichromate treatment and hydrogen plasma treatment for several minutes. Evaluation of the resulting diamond grain showed a good crystalline diamond.

EXAMPLE 5

A Mo plate of 40 mm (diameter)×0.2 mm (thickness) was polished by a diamond wheel of No. 600 (40 to 60 μm), arranged in the quartz tube 2 in the apparatus of FIG. 1, into which a mixture gas of 200 SCCM of hydrogen gas (A), 200 SCCM of Ar gas (B), 4 SCCM of methane gas (C) and 0.8 SCCM of hydrogen peroxide gas (D) (mole ratios: B/(A+B+C+D)=0.494, C/(A+B+C+D)=0.05 and D/C=0.2) was introduced, and diamond was deposited and grown for 1 hour on the Mo plate by the μ-PCVD method at a microwave output of 1.5 KW and a pressure of 400 torr, thus obtaining a diamond grain grown to a diameter of 500 μm.

Evaluation of the thus obtained diamond grain in an analogous manner to Example 1 taught formation of a good crystalline diamond.

EXAMPLE 6

A Cu plate of 25 mm×25 mm×2.5 mm (thickness) was subjected to an ultrasonic washing and scratching treatment using diamond powder of No. 5000 (½ to 2 μm) with acetone for 30 minutes, arranged in the apparatus of FIG. 1 in such a manner that the height h of the substrate surface from the lower surface of the waveguide be 20 mm as shown in FIG. 4 and a sheath thermocouple of shielded alumel-chromel was provided under the substrate to measure the substrate temperature. A mixture gas of 400 SCCM of hydrogen gas (A), 80 SCCM of Ar gas (B), 6 SCCM of methane gas (C) and 3 SCCM of steam gas (D) (mole ratios: B/(A+B+C+D)=0.164, C/(A+B+C+D)=0.0123, D/C=0.5) was introduced into the above described apparatus and diamond was deposited and grown on the Cu substrate for 1 hour by the μ-PCVD method at a microwave output of 300 W, a pressure of 80 torr and a substrate temperature of 300° C., thus obtaining a diamond film with a thickness of 4 μm.

Evaluation of this diamond film in an analogous manner to Example 1 indicated a good crystalline diamond.

According to the present invention, synthesis or coating of diamond excellent in crystalline property as well as transparency can be carried out at a higher speed, namely at least several μm/hour and not only diamond film but also diamond grain can selectively be synthesized at a high speed by controlling the pressure and other conditions.

The applications to diamond wheel grains, heat sinks, semiconductor devices, etc., which have depended on only the ultra-high pressure method up to the present time, can be rendered possible by the chemical vapor synthesis method according to the present invention. Furthermore, it is possible to provide not only diamond thin films with a thickness of at most several μm but also diamond substrate materials with a thickness of at least several ten μm in fields needing high thermal conductivity, small dielectric coefficiency, high transparency, high specific elasticity, high strength, high wear resistance, ambient resistance, etc.

The process of the present invention can readily be applied to the prior art apparatus for the vapor synthesis of diamond and is superior to the prior art process using DC and Rf plasma torch apparatus with respect to the operational stability, installation cost, raw material cost, after-processing cost of the synthesized diamond film, etc.

What is claimed is:

1. A process for the vapor phase synthesis of diamond having a percent transmission of visible rays at a wavelength of 600 nm of at least 10%, which consists essentially of using, as a raw material gas, a mixed gas of hydrogen gas A, an inert gas B, a carbon atom-containing gas C and an oxygen atom-containing inorganic gas D in such proportion as satisfying the following relationship by molar ratio:

$$0.001 \leq B/(A+B+C+D) \leq 0.95$$

$$0.001 \leq C/(A+B+C+D) \leq 0.1$$

$$0.0005 \leq D/C \leq 10$$

wherein the carbon atom-containing gas C is selected from the group consisting of methane, acetylene and ethanol, and the oxygen atom-containing inorganic gas D is selected from the group consisting of oxygen, steam, hydrogen peroxide, carbon monoxide, and carbon dioxide, feeding the mixed gas into a reactor in which plasma is then formed by applying a microwave electric field of at least 500 MHz at a pressure of 40 to 760 torr and thereby depositing and forming diamond on a substrate arranged in the reactor wherein the reactor has neither nozzle nor partition plate to throttle or inject a gas flow.

2. The process as claimed in claim 1, wherein the mixed gas satisfying the following relationship by molar ratio:

$$0.04 \leq B/(A+B+C+D) \leq 0.9$$

$$0.005 \leq C/(A+B+C+D) \leq 0.05$$

$$0.001 \leq D/C \leq 3$$

is fed to a reactor, in which plasma is formed by applying a microwave of at least 500 MHz at a pressure of 60 to 400 torr.

3. The process as claimed in claim 1, wherein the inert gas is at least one member selected from the group consisting of helium, neon, argon, krypton and xenon.

4. The process as claimed in claim 1, wherein the substrate is a material selected from the group consisting of Si, Mo, W, Ta, Nb, Zr, boron, carbon, Al, SiC, $Si_3N_4$, MoC, $Mo_2C$, WC, $W_2C$, TaC, NbC, BN, $B_4C$, AlN, TiC, TiN, and Ti.

5. The process as claimed in claim 1, wherein the mixed gas satisfying the following relationship by molar ratio:

$$0.01 \leq B/(A+B+C+D) \leq 0.95$$

$$0.002 \leq C/(A+B+C+D) \leq 0.08$$

$$0.001 \leq D/C \leq 5$$

is fed to a reactor, in which plasma is formed by applying a microwave electric field of at least 500 MHz at a pressure of 40 to 760 torr.

6. The process as claimed in claim 1, wherein the substrate is diamond.

7. The process as claimed in claim 6, wherein the substrate is sintered diamond.

* * * * *